United States Patent [19]
Yoshida

[11] Patent Number: 5,068,857
[45] Date of Patent: Nov. 26, 1991

[54] ERROR CORRECTION CIRCUIT

[75] Inventor: Hideo Yoshida, Kamakura, Japan

[73] Assignee: Mitsubishi Denki Kabushiki Kaisha, Tokyo, Japan

[21] Appl. No.: 401,968

[22] Filed: Sep. 1, 1989

[30] Foreign Application Priority Data

Sep. 2, 1988 [JP] Japan ................ 63-218262

[51] Int. Cl.⁵ .............................. G06F 11/10
[52] U.S. Cl. .................... 371/37.7; 371/37.4; 371/37.6
[58] Field of Search ............ 371/37.7, 37.4, 37.6, 371/37.1, 38.1, 39.1, 40.1

[56] References Cited

U.S. PATENT DOCUMENTS 4,785,451 11/1988 Sako ........................ 371/37.7 X
4,949,342 8/1990 Shimbo ..................... 371/40.1

FOREIGN PATENT DOCUMENTS 96163 12/1983 European Pat. Off. ........... 371/37.7

OTHER PUBLICATIONS

Yoshida et al., "A Study of Decoding RS Codes with Galois Operation Unit", *The 9th Information Theory and its Application Symposium*, pp. 167–170 (1986).

Yoshida et al., "Error Correction Unit for Optical Disks", *Sho 61 Shin So Zen Tai*, 6–53 (1987).

S. Broadbent, "Real Time Diagnostics Logging and Analysis", vol. 26, No. 10A, Mar. 1984, pp. 5001–5003 (IBM TDB).

C. Chen, "High-Speed Cyclic Redundancy Checking Scheme for Error Correcting Codes", vol. 22, No. 6, 11/1979, pp. 2365–2368, (IBM TDB).

"American National Standard 130 mm Re-Writable Optical Disk Cartridge", Tech. Comm. of Accredited Standards Comm. X3, pp. 41–42, 4/1988.

Primary Examiner—Robert W. Beausoliel
Attorney, Agent, or Firm—Wolf, Greenfield & Sacks

[57] ABSTRACT

An error correction circuit has a parallel circuit of an RS code sequence circuit and a CRC coding sequence circuit to form a sequence circuit and a control circuit for selecting either one of them depending on the desired operation mode.

22 Claims, 5 Drawing Sheets

ERROR CORRECTION CIRCUIT

BACKGROUND OF THE INVENTION

The present invention relates generally to error correction circuits for recording media by error correction in Reed Solomon (RS) codes and error detection in cyclic redundancy codes (CRCs) and, more particularly, to an error correction circuit with high speed CRC computation capability.

In digital audio disks (DADs), digital audio tapes (DATs), and optical disks, m bits of information are handled as a single symbol, and RS codes, in which t symbols are correctable for 2t redundancy symbols and m=8, are used.

In optical disks, RS codes for correcting 8 symbols are used in contrast to other recording media where RS codes for correcting 2 or 3 symbols are used. One way to correct 8 symbols at high speeds is to perform a repeated operation, such as Euclid or Berlekamp algorithm, with a Galois field operation circuit such as shown in Yoshida et al. "A study of Decoding RS Codes with Galois Operation Unit" *The* 9th Information Theory and its Application Symposium, pp. 167-170 (1986).

A conventional error correction circuit, such as shown by Yoshida et al. "Error Correction Unit for Optical Disks" *Sho* 61 *Shin So Zen Tai*, 6-53 (1987), is shown in FIG. 3. In order to handle long codes, sequence circuits for performing syndrome computation of RS codes from the received data are paralleled to find an error location.

This error correction circuit includes a buffer memory 1 for storing a plurality of interleaved data streams which includes RS codes (external codes) and CRC (internal codes); an interface 2 for untying the interleaving in the buffer memory 1; a Galois field operation circuit 3 for performing the four rules of arithmetic in the Galois field based on a syndrome of each RS code; and a sequence circuit 4 for performing not only computation of the syndrome of a RS code from each data block but also parallel operations of the Chinen search from the results of the four rules of arithmetic operation. These components are connected via data buses.

A control circuit 5 controls the interface 2, the Galois operation circuit 3, and the sequence circuit 4. A CRC coding sequence circuit, which is fabricated on a separate chip from the sequence circuit 4 and described hereinafter, is connected to the control circuit 5.

The data streams having CRCs as internal codes and RS codes as external codes are highly error detectable and has low probabilities of wrong correction in the loss correction in RS codes. The interleaved structure of these codes is highly resistant to burst errors. CRCs are a sort of cyclic codes aiming at error detection, and RS codes also are as useful for error detection as CRCs. RS codes are also used for 5¼" write-once-read many (WORM) optical disks and about to be standardized. See ISO/TC 97/SC23, Proposal for ISO, first ISO DP9171/4, July 1987.

FIG. 4 shows an exaple of the standard format of 512 bytes per sector. For the RS codes used herein, the primitive polynomial p(X) is $$p(X) = X^8 + X^5 + X^3 + X^2 + 1 \tag{1}$$

and the generator polynomial G (X) is $$G(X) = \prod_{i=120}^{135} (X - \alpha^i) \tag{2}$$

wherein $\alpha^i = (\beta^i)^{BB}$ and $\beta$ is an element of the primitive polynomial p(X). For the CRCs, the primitive plolynomial is the same as p(X) and the generator polynomial g(X) is $$g(X) = \prod_{i=136}^{139} (X - \alpha^i) \tag{3}$$
$$= X^4 + \alpha^{97}X^3 + \alpha^{228}X^2 + \alpha^{117}X + \alpha^{40}$$

In the format of FIG. 4. an RS check symbol is provided at the end of each of code words #0-#4.

The generation of a CRC check symbol in the CRC coding sequence circuit is described below. First of all, I(X) is determined from data using the following Eq. (4).

$$I(X) = \left(\sum_{j=0}^{L-1} i_{j,n-d}\right)X^{n-d} + \left(\sum_{j=0}^{L-1} i_{j,n-d-1}\right)X^{n-d-1} + \ldots + \left(\sum_{j=0}^{L-1} i_{j,1}\right)X + \left(\sum_{j=0}^{L-1} i_{j,0}\right) \tag{4}$$

wherein L is the number of interleaves, n the code length, d is the minimum distance in RS codes, and $i_{j,k}$ the information symbol. If $i \geq L-4$, then $i_{j,o}=0$.

For 512 bytes per sector, L=5, n=122, d=17. Hence, the CRC check symbol C(X) with respect to I(X) is $$C(X) = I(X)X^4 + Re[I(X)X^4/g(X)] \tag{5}$$
$$= I(X)^4 + a_3X^3 + a_2X^2 + a_1X + a_0$$

wherein Re[A/B] is the excess polynomial of A/B and a (k=0-3) the CRC check symbol. The check symbol ak of Eq. (5) can be determined with a simple circuit if I(X) is given.

FIG. 5 shows such a CRC coding sequence circuit which includes an input terminal 6, an output terminal 7 for CRC check symbols a0-a4, a control signal input terminal 8 connected to the control circuit 5, four 8-bit registers 9-12, four OR circuits 13-16 each connected to the output of each register, four $\alpha^M$ multiplication circuits 17-20, wherein M is 40, 117, 228, and 97 in Eq. (3), each connected to the input of each register, and an AND gate 21 for feeding each multiplication circuit 17-20 with a logical product of an output of the OR circuit 16 and a control signal from the control signal input terminal 8.

In operation, when a reset signal is applied to the registers 9-12 via the control signal input terminal 8 to clear the contents of each register and I(X) is fed to the input terminal 6 in the order of degree, the symbol of I(X) is logically added to the output of the register 12 in the OR circuit 16 and fed to the multiplication circuits 17-20 via the AND gate 21. The data multiplied by $\alpha^{40}$ in the multiplication circuit 17 is latched in the register 9 with the timing signal inputted via the control signal input terminal 8. The data multiplied by $\alpha^{117}$ in the multiplication circuit 18 is logically added to the output of the register 9 in the OR circuit 13 and the result is latched in the register 10 with the timing signal inputted via the control signal input terminal 8. The data outputted from the multiplication circuits 19 and 20 are processed in the same way as above. When the entire data I(X) is inputted, the data of a0, a1, a2, and a3 of Eq. (5) are latched in the registers 9, 10, 11, and 12, respectively.

Then, after the gate 21 is turned off, these data are shifted sequentially through the registers 9-12 and the CRC check symbols a0-a3 are outputted at the output terminal 7. For coding, these CRC check symbols a0-a3 are written in the check symbol write area in the format of FIG. 4 as follows $a_3 \rightarrow i_{1,0}$ $a_2 \rightarrow i_{2,0}$ $a_1 \rightarrow i_{3,0}$ $a_0 \rightarrow i_{4,0}$ For decoding, they are compared to detect errors. The RS codes are corrected for the received words #0-#4 (data including errors) by the following steps.

(1) Find an RS code syndrome from the received word.
(2) Find an error location polynomial and the error value polynomial from the syndrome.
(3) Determine an error location from the error location polynomial by the Chien search.
(4) Determined an error value from the error location, the error location polynomial, and the error value polynomial and make correction.

The steps (2) and (4) are carried out by the Galois field operation circuit 3 while the steps (1) and (3) are carried out by the sequence circuit 4.

The corrected data is stored in the buffer memory 1. After all the code words (coded data) are corrected with RS codes, CRC check symbols are found in the CRC coding sequence circuit of FIG. 5, and the CRCs are computed in the OR circuit.

As described above, if I(X) is given, it is easy to determine the CRC check symbol ak, but it is necessary to not only logically add interleaved information symbols but also make the CRC check symbol portion zero at the zero order of I(X) for computation. In addition, it is impossible to start computation of CRCs in decoding until all the interleaved code words are corrected with the RS codes.

SUMMARY OF THE INVENTION

Accordingly, it is an object of the invention to provide an error correction circuit which is able to compute CRC check symbols at high speeds without determining complex special I(X).

According to the invention there is provided an error correction circuit which includes a parallel circuit of RS code sequence and CRC coding sequence circuits, and a control circuit for selecting one of the above sequence circuits.

The above object and others not specifically mentioned will become clear to those skilled in the art from the following description.

DESCRIPTION OF THE PREFERRED EMBODIMENT

Figure 1:
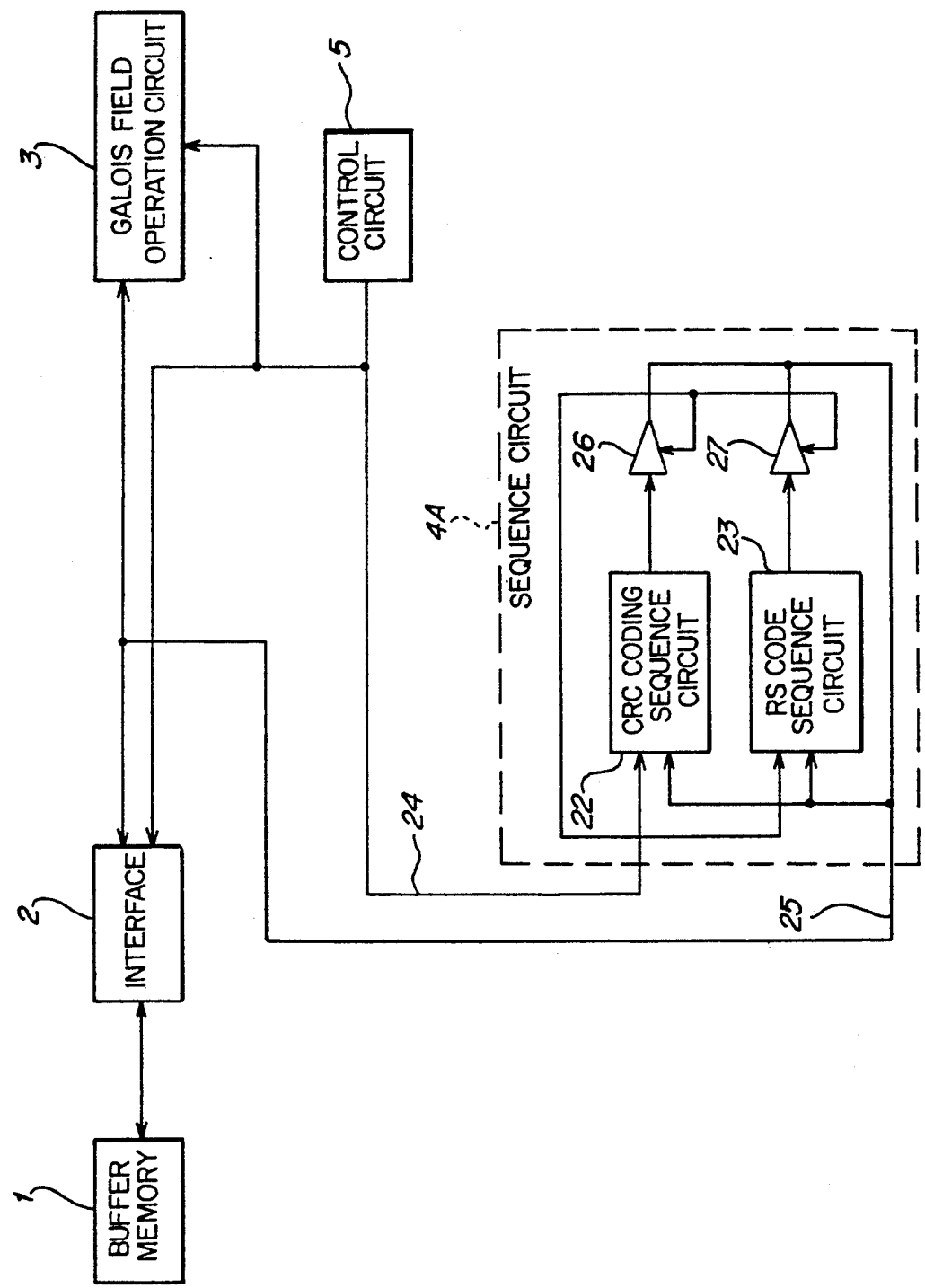
FIG. 1 is a block diagram of an error correction circuit according to an embodiment of the invention.
Figures 3, 4:
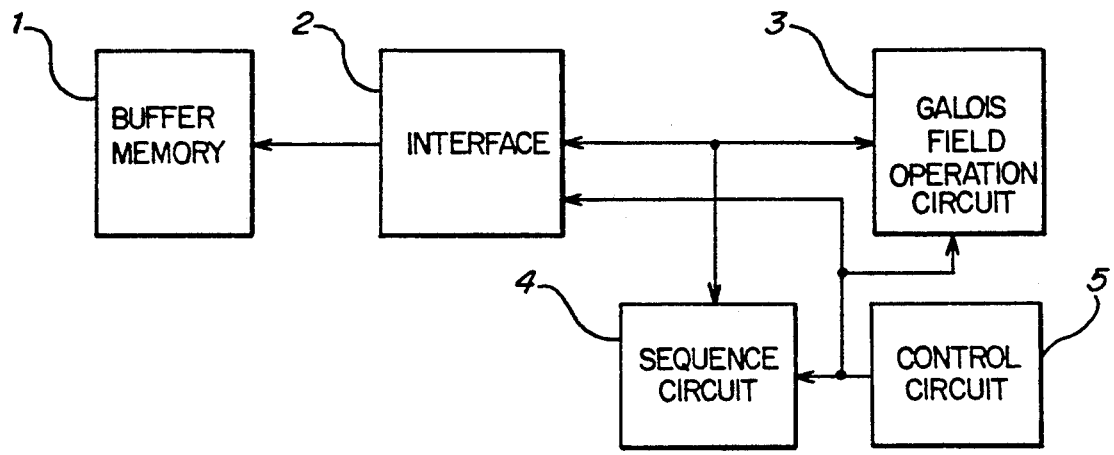
FIG. 3 is a block diagram of a conventional error correction circuit.
FIG. 4 is a diagram showing the standard data format of a 512 bytes/sector optical disk.
Figure 5:
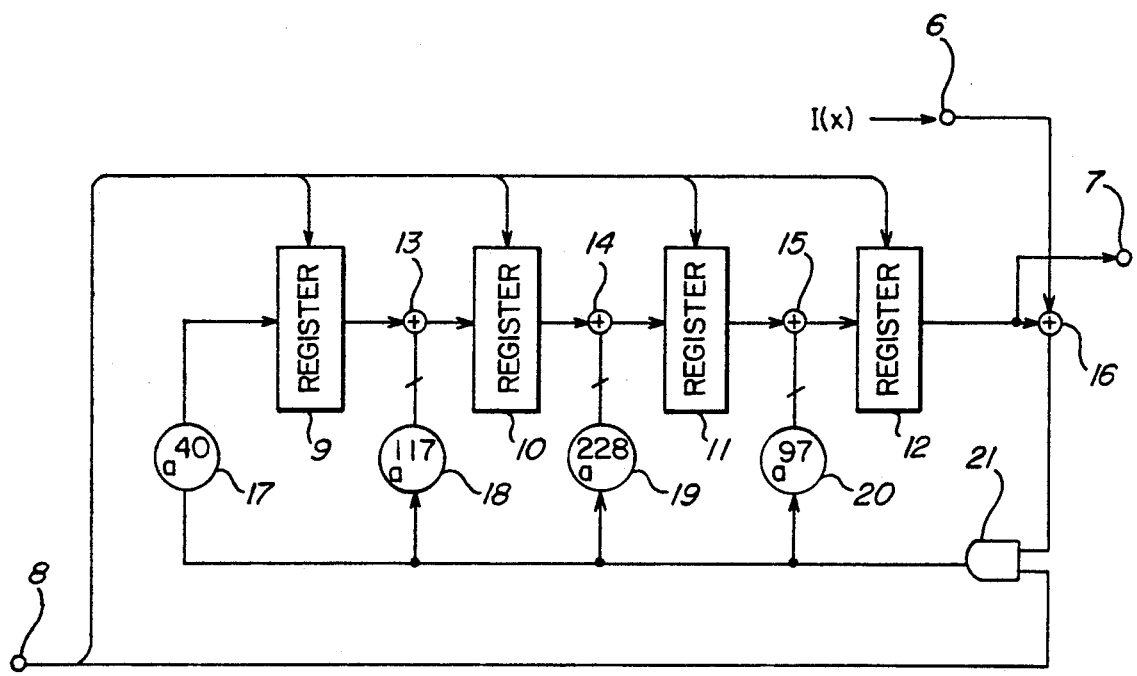
FIG. 5 is a schematic diagram of a conventional CRC coding sequence circuit.

In FIG. 1, like reference numerals denote like or corresponding parts of FIG. 3. A sequence circuit 4A is composed of a parallel circuit of a CRC coding sequence circuit 22 of the same configuration as that of FIG. 5 and an RS code sequence circuit 23 for carrying out the syndrome computation and the Chien search in RS codes. Bus output control gates 26 and 27 are connected to the respective outputs of the CRC coding sequence circuit 22 and the RS code sequence circuit 23. A control signal 24 is inputted to the sequence circuit 4A from the control circuit 5. A data bus 25 connects the sequence circuit 4A to the interface 2 and the Galois field operation circuit 3.

Figure 2A:
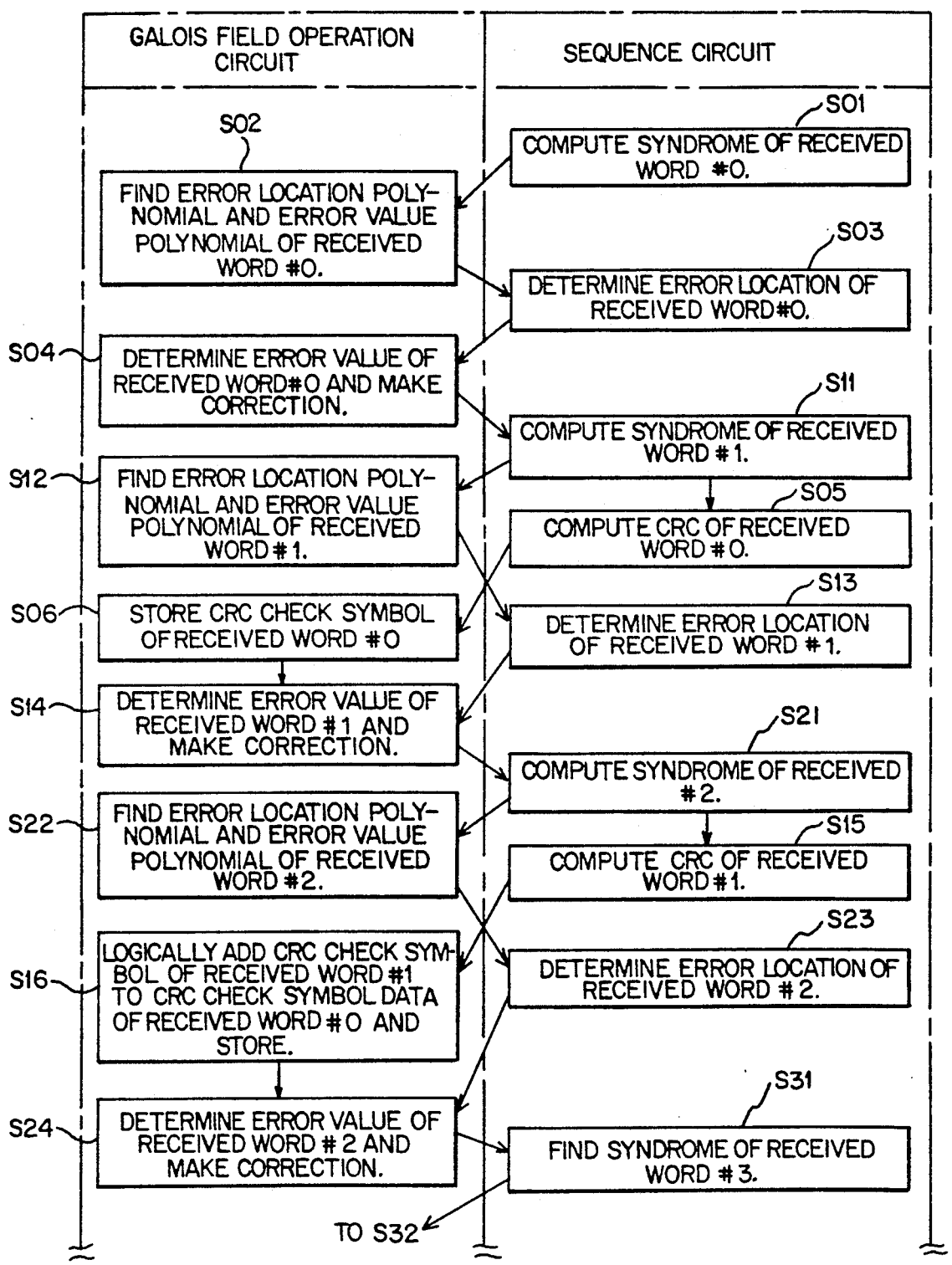
FIGS. 2a and 2b are a flowchart showing the operation of the error correction circuit.
Figure 2B:
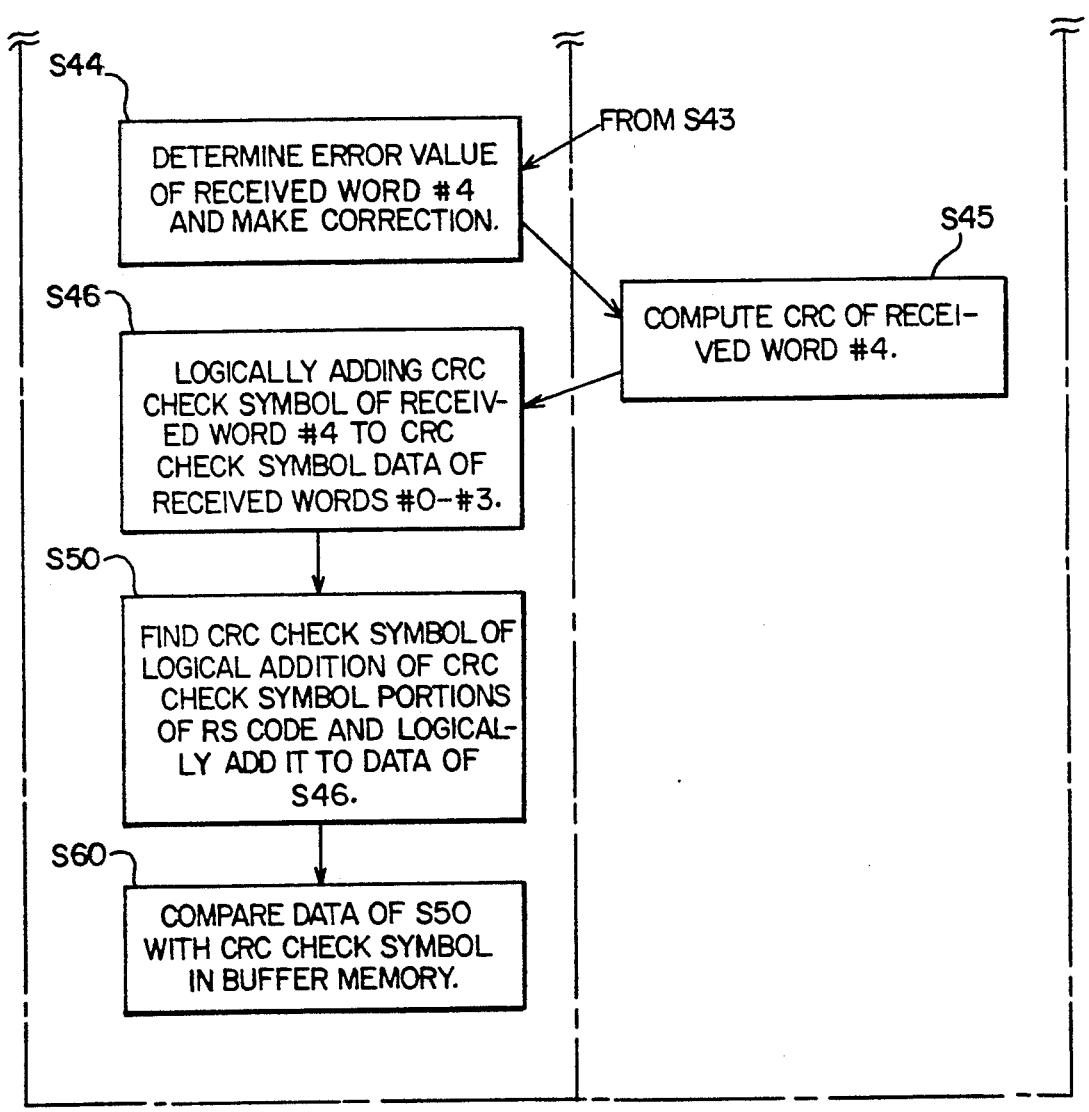

In FIG. 2, the operation of an optical disk with the standard format of FIG. 4 is described. Steps S01, S11, S21, S31, and S41 correspond to the above step (1); S02, S12, S22, S23, and S42 to the above step (2); S03, S13, S23, S33, and S43, to the above step (3); and S04, S14, S24, S34, and S44 to the above step (4). Also, S05, S15, S25, S35, and S45 are CRC computation steps; S06, S16, S26, S36, and S46 CRC check symbol storing steps; S50 is a logical add step; and S60 a comparison step. The intermediate repeated steps S32-S43 are not shown.

In response to the control signal 24, the sequence circuit 4A selects the operation mode in which the RS code sequence circuit 23 operates. After correcting the received word #0 in the steps S01-S04, the RS code sequence circuit 23 finds the syndrome in RS codes of the received word #1 (S11) and transfers it to the Galois field operation circuit 3 via the bus output control gate 27.

The Galois field operation circuit 3 finds an error location polynomial and an error value polynomial from the syndrome data (S12) and continues the correction operation in RS codes. While the RS codes of the next received word are decoded, the RS code sequence circuit 23 is not used.

In response to the control signal 24, the sequence circuit 4A selects the CRC coding sequence circuit 22. The data of the corrected word #0 is inputted to the CRC coding sequence circuit 22 via the buffer memory 1, the interface 2, and the data bus 25 in the order of information symbols $i_{0, n-d}, i_{0, n-d-1}, \ldots, i_{0,0}$. The CRC coding sequence circuit 22 determines the CRC check symbol ak (S05). At this point, a received word is inputted to the input terminals 6 in place of I(X).

When the steps S05 and S12 are completed, the CRC check symbol data of the received word #0 is transferred to the Galios field operation circuit 3 from the CRC coding sequence circuit 22 via the bus output control gate 26 and the data bus 25 and stored until the CRC check symbol data of the received word #1 is determined in the step S15 (S06).

In response to the control signal 24, the sequence circuit 4A selects the RS code sequence circuit 23 to find the error location of the received word #1 by the Chien search based on the respective polynomial data from the Galois field operation circuit 3. When all the error locations of the received word #1 are found, the Galois field operation circuit 3 determines the error values and correct the received word #1 (S14).

All the received words #0–#4 are similarly processed in the format sector of FIG. 4 in the steps S01–S46. The CRC check symbols (a3–a0) on the format ($i_{1,0}$–$i_{4,0}$) are mixed in the information data but left for the time being. The CRC check symbol data of the received word #1 and subsequent words obtained in the steps S15, S25, S35, and S45 are logically added to the CRC check symbol data of the received word #0 in the steps S6, S26, S36, and S46 and stored in the Galois field operation circuit 3.

The CRC check symbol written in the information symbol data portion is logically added in the Galois field operation circuit 3 to find the CRC check symbol, which is logically added to the data obtained from logical addition of the CRC check symbol data of the received words #0–#4 (S50). The resulting CRC check code data is compared with the CRc check code written on the format of the buffer memory 1 (S60) for detecting an error after the correction in RS codes.

In the above decoding operation, an error is detected at the time of computation of CRC check symbols of each respective code stream by computing the CRC check symbol in the CRC coding sequence circuit 22 including the CRC check code portion in the buffer memory 1; computing the CRC check symbol in the Galois operation circuit 3 on the CRC check code portion within the buffer memory 1; logically adding it to the above CRC check symbol in the Galois field operation circuit; and comparing it with the CRC check code in the buffer memory 1 for detecting the error.

In the coding operation, the CRC check code portion in the buffer memory 1 is cleared before computation of the CRC check symbol and, then, the CRC check symbol is computed in the CRC coding sequence circuit 22 including the CRC check code portion in the buffer memory and written in the CRC check code portion of the buffer memory 1.

As described above, with the parallel circuit of RS code and CRC coding sequence circuits, either of which is selected depending on the operation mode, according to the invention, it is possible to detect an error in CRC by adding a minimum circuit necessary for CRC computation without finding a complex special I(X). Since the CRC computation is carried out in parallel with the RS decoding operation, high speed correction in units of sector is obtained.

What is claimed is:

1. An error correction circuit comprising:
    a buffer memory for storing a plurality of interleaved data streams, each having as an external code an RS code for correcting an error in data and as an internal code a CRC for detecting an error in data;
    an interface for untying said interleaved data streams;
    a Galois field operation circuit for carrying out Galois field arithmetic operations on a syndrome of said RS code and determining an error value based on an error location for effecting correction;
    an RS code sequence circuit for computing said syndrome to find an error location from results of said Galois field arithmetic operations by a Chien search;
    a CRC coding sequence circuit for coding and computing said CRC, said RS code sequence circuit and said CRC coding sequence circuit being connected in parallel to together form a sequence circuit; and
    a control circuit for controlling said interface, said Galois field operation circuit, said RS code sequence circuit, and said CRC coding sequence circuit and outputting a control signal for selecting either said RS code sequence circuit or said CRC coding sequence circuit for operation.

2. The error correction circuit of claim 1, wherein;
    the plurality of interleaved data streams comprises a like plurality of interleaved code streams;
    said CRC coding sequence circuit dtermines a first CRC check symbol of a first code stream in said interleaved code streams, which is stored in said Galois field operation circuit;
    said CRC coding sequence circuit determines a second CRC check symbol of a second code stream, which is logically added to said first CRC check symbol and stored; and
    means for carrying out, on each successive code stream other than the first and second code streams, determining of an additional CRC check symbol of an additional such successive code stream, which is logically added to said first CRC check symbol and stored, for the number of times equal to the number of interleaved code streams less two and, in coding, writing a resulting CRC check symbol in said Galois field operation circuit in a CRC check symbol portion of said buffer memory while, in decoding, comparing said CRC check symbol with a CRC check code in said buffer memory for detecting an error.

3. The error correction circuit of claim 1, wherein said CRC coding sequence circuit comprises:
    first means, responsive to a first code stream of said interleaved data streams, for determining a first CRC check symbol for the first code stream;
    second means, responsive to a second code stream of said interleaved data streams, for determining a second CRC check symbol for the second code stream;
    means for logically adding the second CRC check symbol to the first CRC check symbol;
    additional means, responsive to all code streams of said interleaved data streams, for determining corresponding CRC check symbols respectively therefor; and
    additional adding means for logically adding and additional CRC check symbols to said logically added first and second CRC check symbols.

4. The error correction circuit of claim 1, wherein said CRC coding sequence circuit comprises:
    a first AND gate having a first input connected to the output of said control circuit;
    a first plurality of registers each connected to be controlled by said control circuit;
    a first plurality of combining means, each said combining means having a first input connected to the output of a corresponding one of said registers; and
    a first plurality of multiplication means, each of said multiplication means having an input connected to an output of said AND gate, one of said multiplication means being connected to an input of one of said registers, each of said other multiplication means being connected to a second input of a corresponding one of said combining means, each said multiplication means being for producing a signal representative of an input signal applied thereto multiplied by a predetermined power of a constant, wherein one of said combining means has an output connected to a second input of said AND gate and a second input connected to receive input data and at its first input is also connected to provide output data from another of said registers, and wherein each of the other combining means has an output connected to an input of a corresponding one of all but said one of said registers.

5. The error correction circuit of claim 1 or 2 or 3 or 4 wherein, in coding, said CRC coding sequence circuit computes said CRC check symbol including said CRC check code portion in said buffer memory after said CRC check code portion in said buffer memory is cleared.

6. The error correction circuit of claim 1 or 2 or 3 or 4, wherein, in decoding, said CRC coding sequence circuit computes said CRC check symbol including said CRC check code portion of said buffer memory;

said Galois field operation circuit computes another CRC check symbol on said CRC check code portion of said buffer memory and logically adds said another CRC check symbol to said CRC check symbol of said CRC coding sequence circuit to eliminate any influence of said CRC check code on said CRC check symbol; said CRC check symbol being compared with said CRC check code in the buffer memory to detect an error.

7. The error correction of claim 4, wherein said first plurality of combining means comprises a first plurality of OR gates.

8. The error correction circuit of claim 4, wherein said first plurality of combining means comprises a first plurality of exclusive-OR gates.

9. The error correction circuit of claim 4, wherein said first plurality of combining means comprises a first plurality of logical adders.

10. The error correction circuit of claim 1, wherein said control circuit comprises control means for producing said control signal such that for each code stream, said RS code sequence circuit is first selected by said control means to compute an RS code syndrome of that code stream, said CRC coding sequence circuit is then selected by said control means to determine from the syndrome a CRC check symbol for that code stream.

11. The error correction circuit of claim 10, wherein, in coding, said CRC coding sequence circuit computes said CRC check symbol including said CRC check code portion in said buffer memory after said CRC check code portion in said buffer memory is cleared.

12. The error correction circuit of claim 10, wherein, in decoding, said CRC coding sequence circuit computes said CRC check symbol including said CRC check code portion of said buffer memory;

said Galois field operation circuit computes another CRC check symbol on said CRC check code portion of said buffer memory and logically adds said another CRC symbol to said CRC check symbol of said CRC coding sequence circuit to eliminate any influence of said CRC check code on said CRC check symbol;

said CRC check symbol being compared with said CRC check code in the buffer memory to detect an error.

13. The error correction circuit of claim 10, wherein said CRC coding sequence circuit comprises:

first means, responsive to a first code stream of said interleaved data streams, for determining a first CRC check symbol for the first code stream;

second means, responsive to a second code stream of said interleaved data streams, for determining a second CRC check symbol for the second code stream;

means for logically adding the second CRC check symbol to the first CRC check symbol;

additional means, responsive to all code streams of said interleaved data streams, for determining corresponding CRC check symbols respectively therefor; and additional adding means for logically adding said additional CRC check symbols to said logically added first and second CRC check symbols.

14. The error correction circuit of claim 10, wherein said CRC coding sequence circuit comprises:

a first AND gate having a first input connected to the output of said control circuit; a first plurality of registers each connected to be controlled by said control circuit;

a first plurality of combining means, each said combining means having a first input connected to the output of a corresponding one of said registers; and a first plurality of multiplication means, each of said multiplication means having an input connected to an output of said AND gate, one of said multiplication means being connected to an input of one of said registers, each of said other multiplication means being connected to a second input of a corresponding one of said combining means, each said multiplication means being for producing a signal representative of an input signal applied thereto multiplied by a predetermined power of a constant, wherein one of said combining means has an output connected to a second input of said AND gate and a second input connected to receive input data and at its first input is also connected to provide output data from another of said registers, and wherein each of the other combining means has an output connected to an input of a corresponding one of all but said one of said registers.

15. The error correction circuit of claim 14, wherein said first plurality of combining means comprises a first plurality of OR gates.

16. The error correction circuit of claim 14, wherein said first plurality of combining means comprises a first plurality of exclusive-OR gates.

17. The error correction circuit of claim 14, wherein said first plurality of combining means comprises a first plurality of logical adders.

18. The error correction circuit of claim 1, wherein said Galois field arithmetic operations comprise addition, subtraction, multiplication and division in a Galois field.

19. A method for error correction of a code word, said method utilizing an apparatus comprising a CRC coding sequence circuit, an RS code sequence circuit, a Galois field operation circuit connected to provide data to and receive data from the CRC coding sequence circuit and the RS code sequence circuit, and a control circuit for controlling operation of the Galois field operation circuit, the CRC coding sequence circuit and the RS code sequence circuit such that only one of the CRC coding sequence circuit and the RS code sequence circuit can be selected at any one time, the method comprising the steps of:

computing, in the RS code sequence circuit, an RS syndrome of the code word;

in the Galois field operation circuit, determining from the syndrome an error location polynomial and an error value polynomial of the code word;

determining in the CRC coding sequence circuit, from the error location polynomial and error value polynomial, a CRC check symbol indicative of location of any error in the code word; and determining, in the Galois field operation circuit from the error location, the error value of the code word.

20. The error correction method of claim 19, further comprising the step of:

between said step of determining the error location polynomial and error value polynomial and said step of determining the CRC check symbol, in the CRC coding sequence circuit determining from the error location polynomial and the error value polynomial the error location of the code word.

21. The error correction method of claim 20, wherein said apparatus further comprises a buffer memory for storing a plurality of interleaved data streams, each of the streams having as an external code an RS code for correcting an error in data and as an internal code a CRC for detecting an error in data, and an interface interfacing the buffer memory to the Galois field operation circuit, the CRC coding sequence circuit and the RS code sequence circuit and connected to the control circuit for control thereby, the interface being for untying the interleaved data streams, wherein said step of determining the error value comprises:

in the Galois field operation circuit, determining from the error location the error value of the code word and correcting the code word.

22. The error correction method of claim 19, wherein said method further comprises the steps of:

in the Galois field operation circuit, logically adding the CRC check symbols together as each subsequent CRC check symbol is generated to produce a sum CRC check symbol;

after a CRC check symbol for each code stream is generated and logically added into said sum CRC check symbol, logically adding, in the Galois field operation circuit, said sum CRC check symbol to the CRC check symbol of the RS code to produce a full CRC check symbol; and comparing, in the Galois field operation circuit, the full CRC check symbol with a CRC check symbol in the buffer memory.

* * * * *